United States Patent
Iwata et al.

(10) Patent No.: US 7,559,640 B2
(45) Date of Patent: Jul. 14, 2009

(54) LIQUID EJECTION APPARATUS

(75) Inventors: Yuji Iwata, Suwa (JP); Hirotsuna Miura, Fujimi (JP)

(73) Assignee: Seiko Epson Corporation (JP)

( * ) Notice: Subject to any disclaimer, the term of this patent is extended or adjusted under 35 U.S.C. 154(b) by 230 days.

(21) Appl. No.: 11/389,460

(22) Filed: Mar. 24, 2006

(65) Prior Publication Data
US 2006/0221104 A1 Oct. 5, 2006

(30) Foreign Application Priority Data
Mar. 30, 2005 (JP) .............................. 2005-100077

(51) Int. Cl.
*B41J 2/01* (2006.01)
(52) U.S. Cl. ...................... 347/102; 347/101
(58) Field of Classification Search .................. 347/102
See application file for complete search history.

(56) References Cited

U.S. PATENT DOCUMENTS

| | | | | |
|---|---|---|---|---|
| 4,696,659 | A * | 9/1987 | Molaug ....................... 464/148 |
| 6,060,113 | A | 5/2000 | Banno et al. |
| 6,137,503 | A * | 10/2000 | Hashimoto et al. ............ 347/19 |
| 6,322,185 | B1 | 11/2001 | Asano et al. |
| 6,599,582 | B2 | 7/2003 | Kiguchi et al. |
| 6,793,310 | B2 * | 9/2004 | Darby et al. ................... 347/16 |
| 6,805,439 | B2 * | 10/2004 | Maeda et al. .................. 347/96 |
| 6,948,795 | B2 * | 9/2005 | Tashiro et al. ................. 347/40 |
| 7,059,705 | B2 | 6/2006 | Iwata |
| 7,368,149 | B2 | 5/2008 | Katagami et al. |
| 2003/0190419 | A1 | 10/2003 | Katagami et al. |
| 2004/0141023 | A1 | 7/2004 | Nakamura |
| 2004/0189769 | A1 * | 9/2004 | Wilbur et al. ................ 347/102 |
| 2004/0207800 | A1 | 10/2004 | Hiruma |
| 2004/0250874 | A1 | 12/2004 | Takano |
| 2005/0005996 | A1 | 1/2005 | Mizutani |

FOREIGN PATENT DOCUMENTS

| | | |
|---|---|---|
| JP | 10-328605 | 12/1998 |
| JP | 11-077340 | 3/1999 |
| JP | 11-204529 | 7/1999 |
| JP | 11-339642 | 12/1999 |
| JP | 2003-054064 | 2/2003 |
| JP | 2003-127537 | 5/2003 |
| JP | 2003-307613 | 10/2003 |
| JP | 2004-001326 | 1/2004 |
| JP | 2004-154733 | 6/2004 |
| JP | 2004-216737 | 8/2004 |
| JP | 2004-230660 | 8/2004 |
| JP | 2004-298843 | 10/2004 |
| JP | 2004-358729 | 12/2004 |
| TW | 221427 | 10/2004 |

* cited by examiner

*Primary Examiner*—Matthew Luu
*Assistant Examiner*—Brian J Goldberg
(74) *Attorney, Agent, or Firm*—Harness, Dickey & Pierce, P.L.C.

(57) ABSTRACT

According to an aspect of the invention, a liquid ejection apparatus including a head unit is provided. The head unit is movable on an object at least in two-dimensional directions. The head unit includes an ejecting portion and a radiating portion. The ejecting portion ejects droplets onto the object. The radiating portion radiates a laser beam onto the droplet received by the object. A controller adjusts the position of the ejecting portion and the position of the radiating portion in correspondence with a movement direction of the head unit. Thus, productivity is improved by efficiently drying and baking ejected liquid droplets.

8 Claims, 9 Drawing Sheets

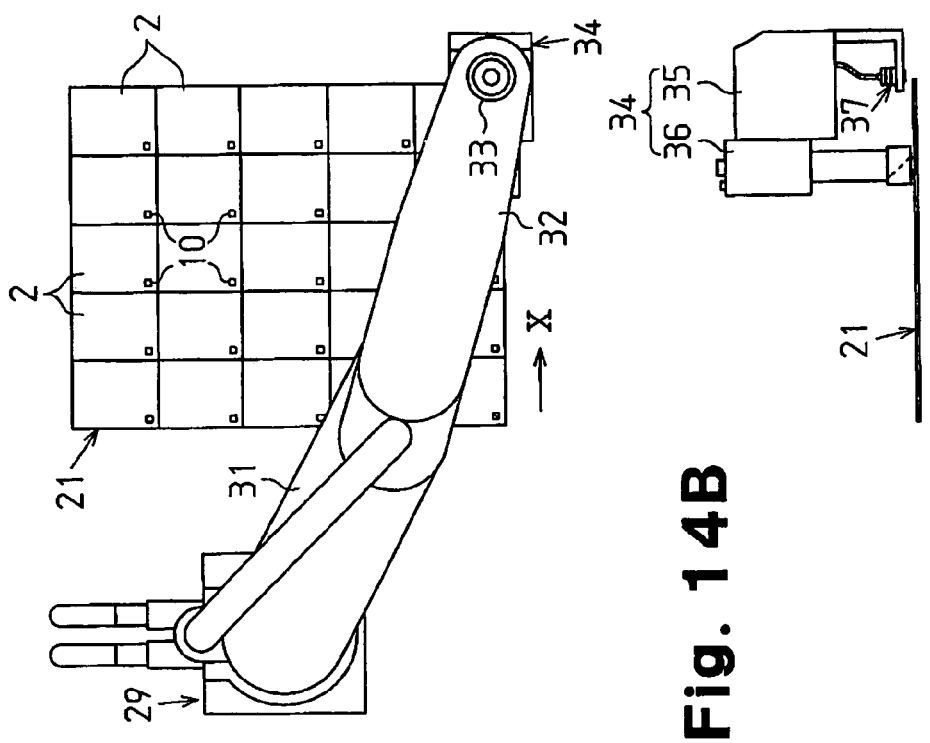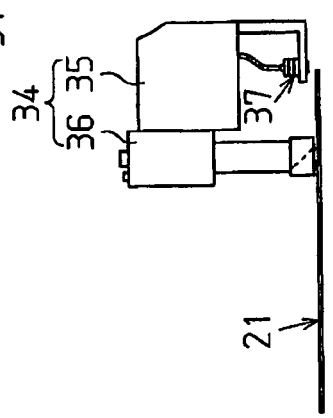
Fig. 13A
Fig. 13B
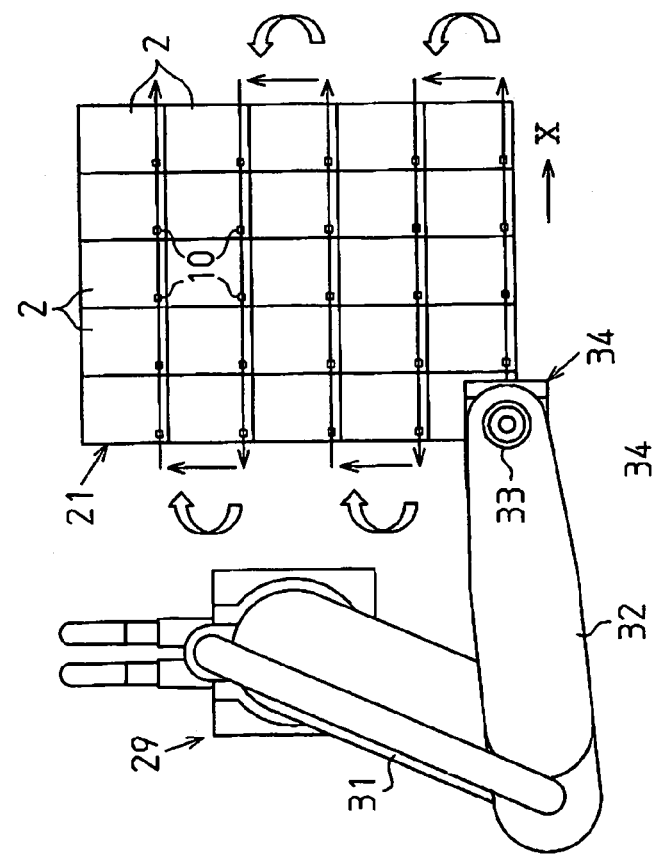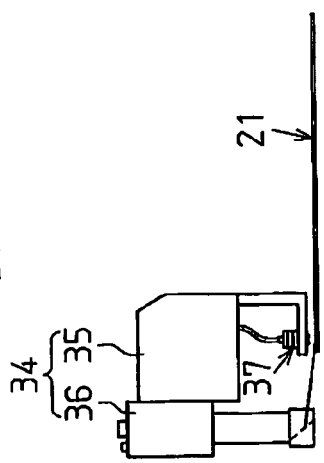
Fig. 14A
Fig. 14B

LIQUID EJECTION APPARATUS

CROSS-REFERENCE TO RELATED APPLICATIONS

This application is based upon and claims the benefit of priority from prior Japanese Patent Application No. 2005-100077, filed on Mar. 30, 2005, the entire contents of which are incorporated herein by reference.

BACKGROUND OF THE INVENTION

The present invention relates to liquid ejection apparatuses.

Typically, an electro-optic apparatus such as a liquid crystal display and an organic electroluminescence display (an organic EL display) includes a transparent glass substrate (hereinafter, a substrate) on which an image is displayed. An identification code (for example, a two-dimensional code) is formed on the substrate for the purpose of quality control and production management. The identification code represents encoded product information including the name of the manufacturer and the product number of the substrate. The identification code is provided by structures (defined by, for example, colored thin films or recesses) formed in selected ones of a number of aligned cells (data cells). The identification code thus represents the encoded product information.

As methods for forming such identification codes, a laser sputtering method and a waterjet method have been proposed (see Japanese Laid-Open Patent Publication Nos. 11-77340 and 2003-127537). Specifically, in the laser sputtering method, an identification code is formed through sputtering of a metal foil involving radiation of laser beams onto the metal foil. In the waterjet method, water containing abrasive is ejected onto a substrate and thus marks the identification code on the substrate.

However, in the laser sputtering method, in order to form the identification code in accordance with a desired size, the distance between the metal foil and a substrate must be set to several to several tens of micrometers. Thus, the opposing surfaces of the metal thin film and the substrate must be precisely formed to be flat and spaced from each other by a distance adjusted accurately in the order of micrometers. As a result, the laser sputtering method is applicable only to limited types of substrates, or cannot be used widely for general substrates. Further, in the waterjet method, water, dust, or abrasive is splashed onto the substrate when forming the code, leading to contamination of the substrate.

To solve these problems, an inkjet method has been focused on as an alternative. In the inkjet method, droplets of liquid containing metal particles are ejected through a liquid ejection head. The liquid droplets are then dried and thus the identification code is provided. The inkjet method is thus applicable to a wider range of substrates and prevents contamination of the substrate in formation of the identification code.

More specifically, in the inkjet method, each liquid droplet is first dried on the substrate after having been received by the substrate. Subsequently, functional material contained in the droplet is baked and thus bonded securely with the substrate. That is, the method includes a drying step for fixing the shape of the droplet and a baking step for baking and solidifying the functional material. The drying and baking steps are essential for forming the identification code having an appropriate shape. Therefore, in order to efficiently perform these steps, a liquid ejection apparatus that performs the inkjet method must include a laser radiating portion in the vicinity of a liquid ejection head. The laser radiating portion radiates laser beams so as to dry and bake the liquid droplets.

The inkjet method is performed on a variety of substrates, which may be defined by panels of different sizes. Further, the positions for forming the identification codes may vary from one panel to another. It is thus necessary to provide an apparatus that can be flexibly used for the inkjet method. Further, it is desired that productivity be improved by quickly drying and baking liquid droplets that have been received by a substrate.

SUMMARY

Accordingly, it is an objective of the present invention to provide a liquid ejection apparatus that improves productivity by efficiently drying and baking ejected liquid droplets through laser radiation onto the droplets.

According to an aspect of the invention, a liquid ejection apparatus including a head unit is provided. The head unit is movable on an object at least in two-dimensional directions. The head unit includes an ejecting portion and a radiating portion. The ejecting portion ejects droplets onto the object. The radiating portion radiates a laser beam onto the droplet received by the object. A controller adjusts the position of the ejecting portion and the position of the radiating portion in correspondence with a movement direction of the head unit.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 13A is a plan view for explaining operation of the SCARA robot of FIG. 5;

FIG. 13B is a side view of FIG. 13A;

FIGS. 14A, 15A, and 16A are plan views for explaining the operation of the SCARA robot of FIG. 5 sequentially from FIG. 13A; and FIGS. 14B, 15B, and 16B are side views of FIGS. 14A, 15A, and 16A, respectively.

DETAILED DESCRIPTION OF THE PREFERRED EMBODIMENTS

An embodiment of the present invention will now be described with reference to FIGS. 1 to 16B.

Display Module

First, a display module of a liquid crystal display having an identification code 10, which is formed by a liquid ejection apparatus 20 according to the present invention, will be explained.

Figure 1:
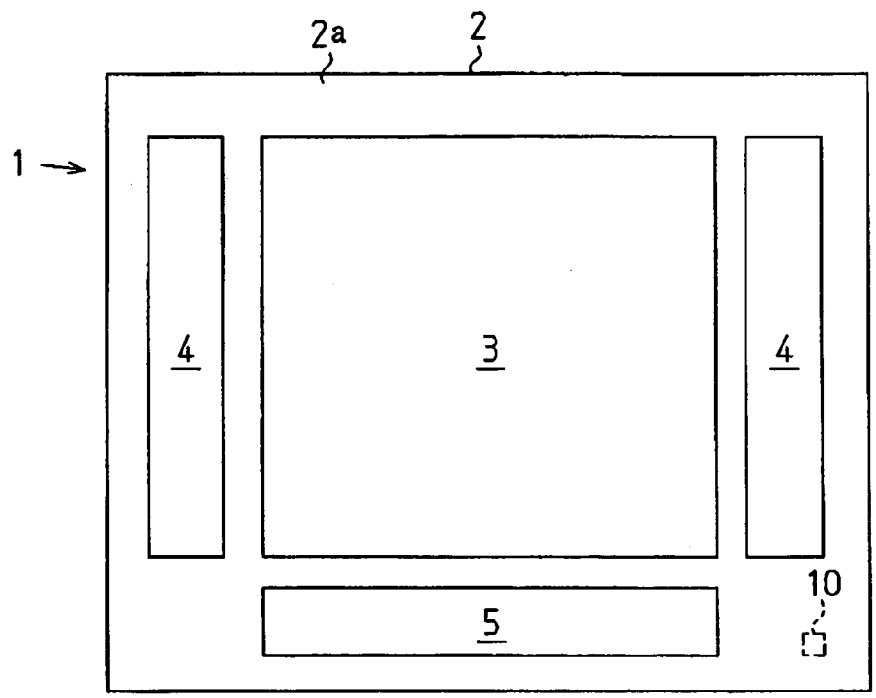
FIG. 1 is a front view showing a liquid crystal display module incorporated in a liquid crystal display according to an embodiment of the present invention.

As shown in FIG. 1, a liquid crystal display module 1 includes a transparent glass substrate (hereinafter, simply referred to as a substrate 2) serving as a light-transmittable display substrate. A rectangular display portion 3 is formed substantially at the center of a surface 2a of the substrate 2. Liquid crystal molecules are sealed in the display portion 3. A scanning line driver circuit 4 and a data line driver circuit 5 are arranged outside the display portion 3. The scanning line driver circuit 4 generates scanning signals and the data line driver circuit 5 generates data signals. In correspondence with the signals, the liquid crystal display module 1 controls the orientations of the liquid crystal molecules. The liquid crystal display module 1 modulates area light emitted by a non-illustrated illumination device in accordance with the orientations of the liquid crystal molecules. In this manner, a desired image is displayed on the display portion 3.

Figure 2:
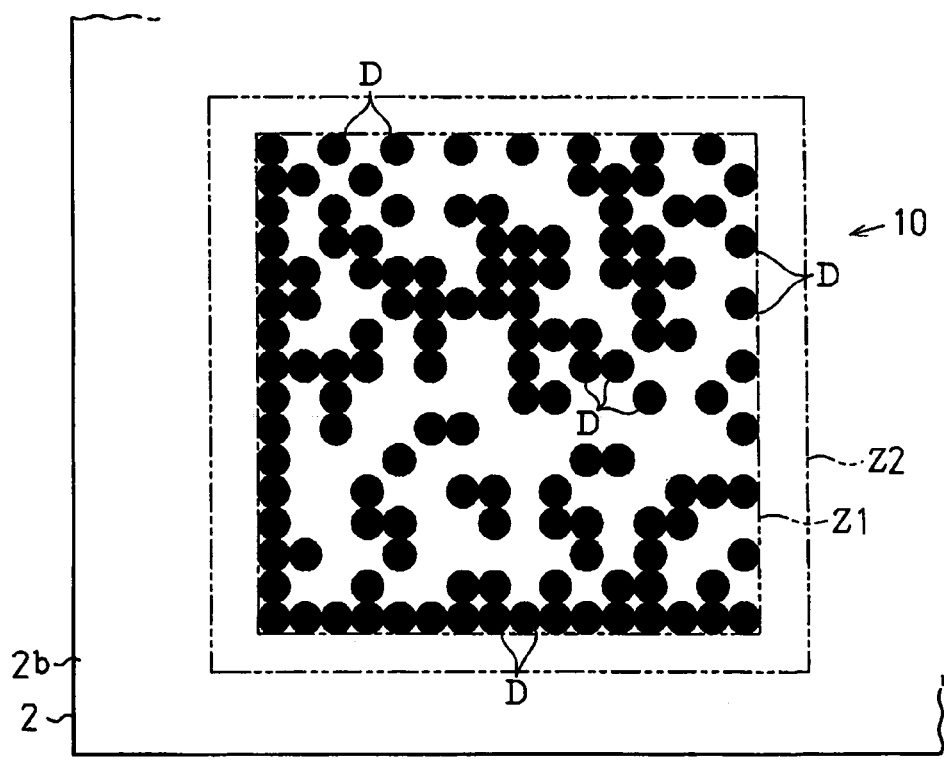
FIG. 2 is an enlarged view showing an identification code formed on a backside of the liquid crystal display module of FIG. 1.

Referring to FIGS. 1 and 2, the identification code 10 of the liquid crystal display module 1 is formed at a bottom right corner of a backside 2b of the substrate 2, as viewed in FIG. 1. The identification code 10 is defined by a plurality of dots D provided in a dot formation area Z1, as shown in FIG. 2.

A prescribed blank area Z2 is defined around the outer circumference of the dot formation area Z1. In the illustrated embodiment, the identification code 10 provided in the dot formation area Z1 is defined by a two-dimensional code and thus readable by a two-dimensional code reader. The blank area Z2 is defined by an empty area in which the dots D are not formed. The blank area Z2 thus allows the two-dimensional code reader to identify the dot formation area Z1 and prevents erroneous detection of the identification code 10, which is contained in the dot formation area Z1.

Figure 4:
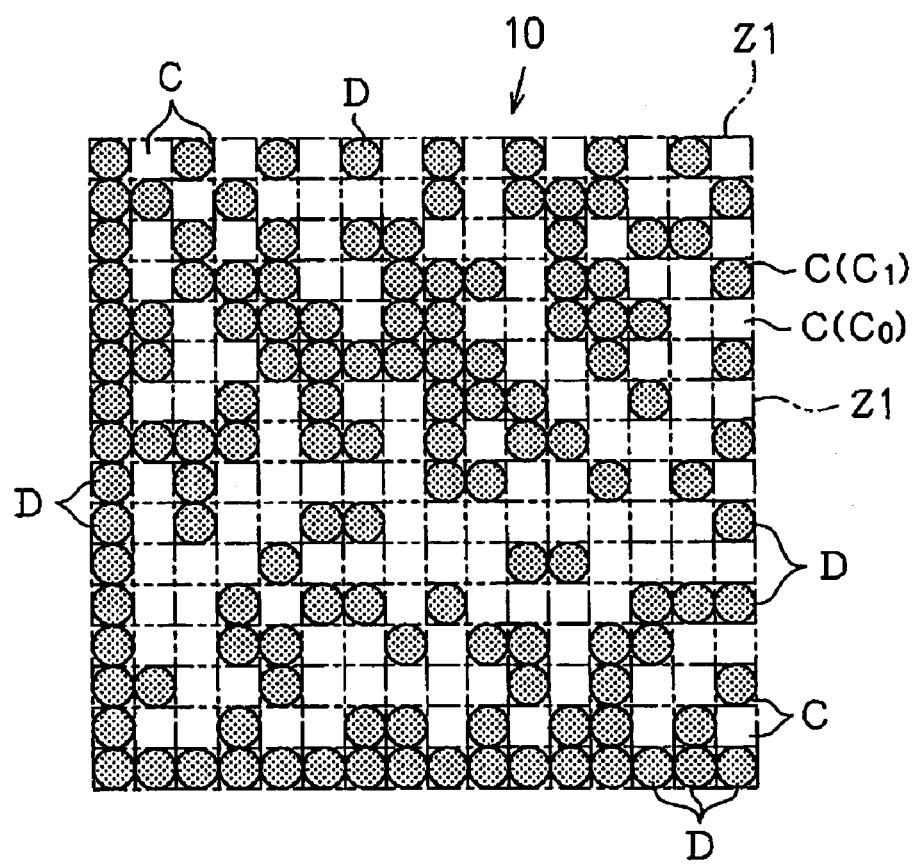
FIG. 4 is a diagram for explaining the configuration of the identification code of FIG. 2.

The dot formation area Z1 is defined by a square zone each side of which is 1 to 2 millimeters. As shown in FIG. 4, the dot formation area Z1 is virtually divided into 256 cells C that are aligned in accordance with 16 lines by 16 rows. The dots D are formed in selected ones of the cells C and thus define the identification code 10 that identifies the product number or the lot number of the liquid crystal display module 1.

Figure 3:
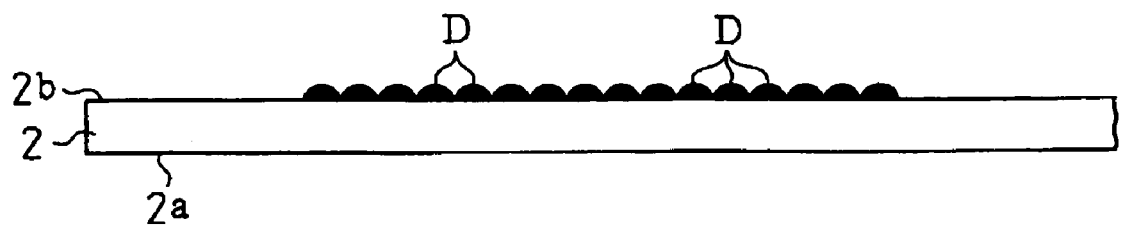
FIG. 3 is an enlarged side view showing the identification code formed on the backside of the liquid crystal display module of FIG. 1.

In the illustrated embodiment, each of the occupied cells C, which contains the dot D, is defined as a black cell C1 (a dot section). Each of the empty cells C is defined as a blank cell C0 (a non-dot section). As shown in FIGS. 2 and 3, each of the dots D formed in the corresponding black cell C1 has a semispherical shape and is securely bonded with the substrate 2. In the illustrated embodiment, each dot D is formed using the liquid ejection apparatus 20, which will be described later. More specifically, with reference to FIG. 9, a droplet Fb of liquid Fa containing a patterning maternal (for example, metal particles such as manganese particles) is ejected from a nozzle N onto the corresponding cell C (black cell C1). The droplet Fb is thus received by the black cell C1 and then dried. Subsequently, the metal particles of the droplet Fb are baked. This provides the dot D formed of metal that has the semispherical shape and is securely bonded with the substrate 2.

Configuration of Liquid Ejection Apparatus

Figure 5:
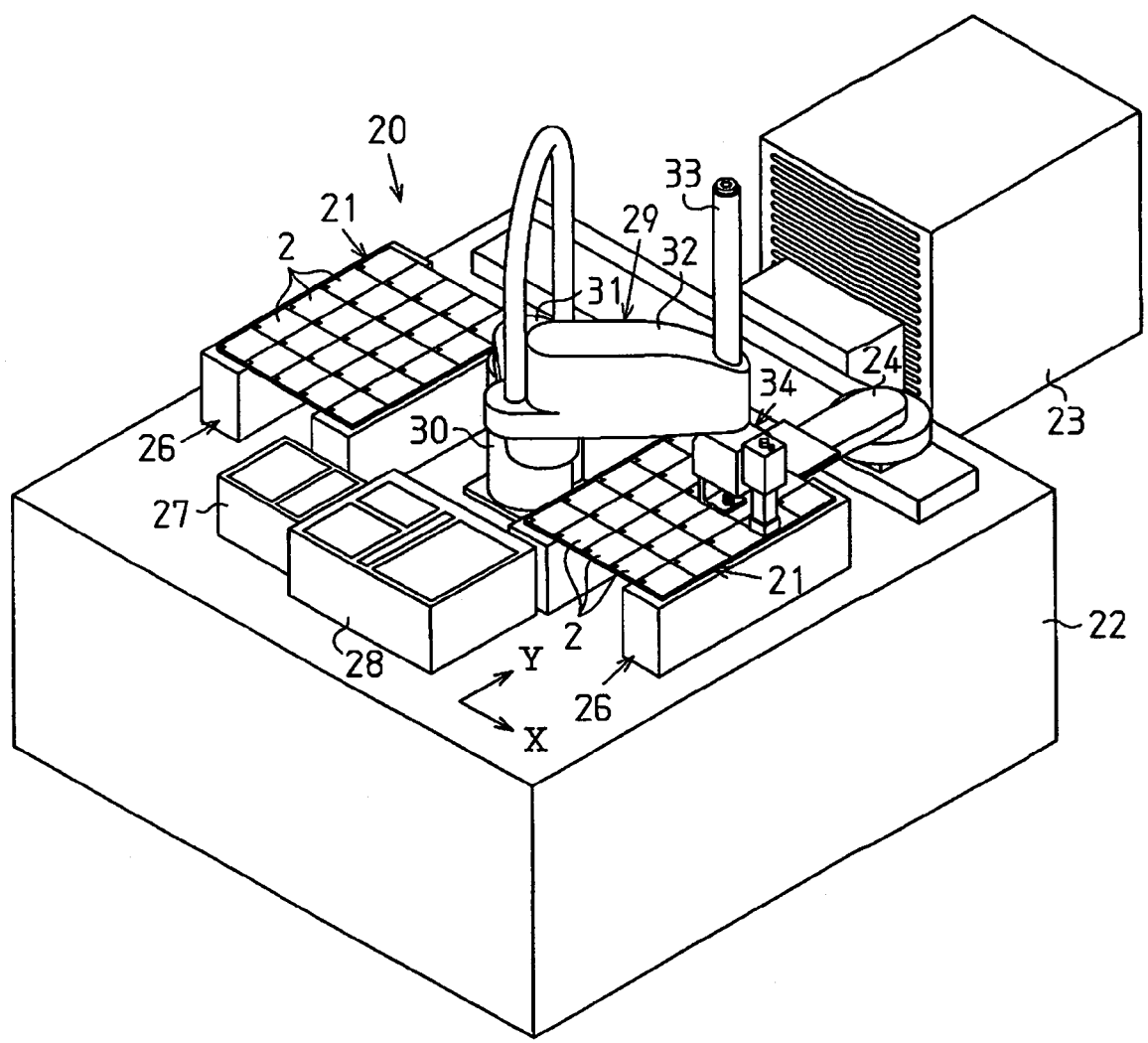
FIG. 5 is a perspective view showing a liquid ejection apparatus according to the illustrated embodiment that employs a SCARA robot for forming the identification code of FIG. 2.
Figure 6:
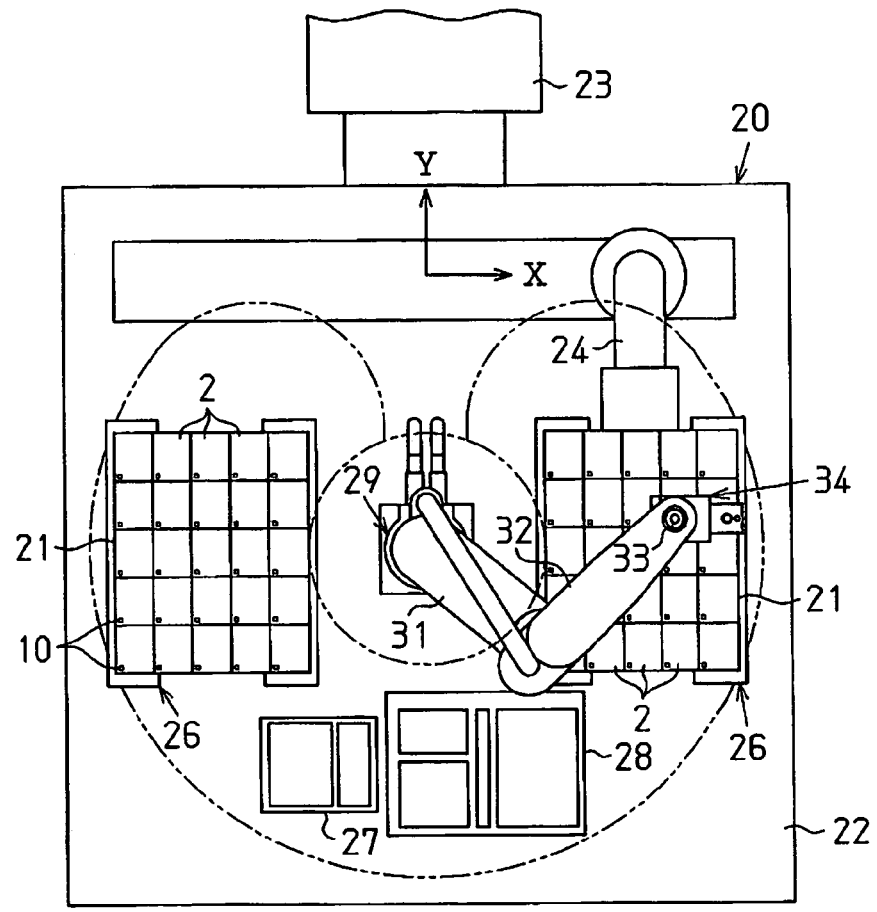
FIG. 6 is a plan view showing the liquid ejection apparatus of FIG. 5.
Figure 7:
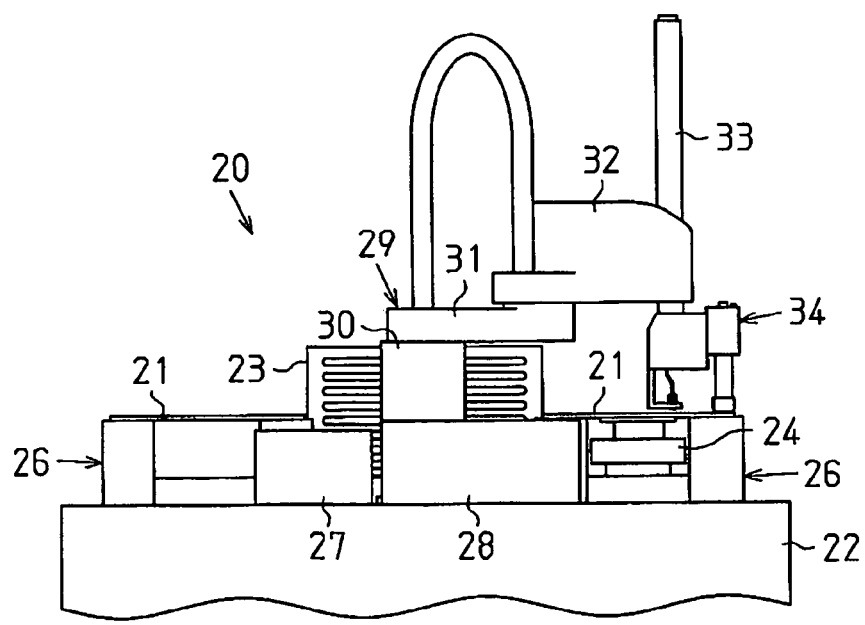
FIG. 7 is a front view showing the liquid ejection apparatus of FIG. 5.

The liquid ejection apparatus 20 used for forming the identification code 10 on the backside 2b of the substrate 2 will hereafter be explained. FIG. 5 is a perspective view showing the liquid ejection apparatus 20 as a whole. FIG. 6 and FIG. 7 are a plan view and a front view, respectively, each showing the liquid ejection apparatus 20. In the illustrated embodiment, the droplets Fb are ejected onto a panel 21 that includes the multiple substrates 2. The panel 21 is formed by aligning the substrates 2 as an integral body in a matrix-like manner. The dot formation area Z1 on each of the substrates 2 corresponds to a liquid ejection area, i.e., a droplet receiving area.

Referring to FIGS. 5 to 7, the liquid ejection apparatus 20 has a parallelepiped base 22. A SCARA robot 29 serving as an articulated robot, which will be later explained, is arranged at the center of the base 22. A panel stocker 23 is arranged at a side of the base 22 and receives the multiple panels 21 in a state vertically stacked and spaced from adjacent ones. The panel stocker 23 is selectively raised and lowered by a non-illustrated lift mechanism.

A substrate transport arm 24 is secured to a portion of an upper surface of the base 22 beside the panel stocker 23. The substrate transport arm 24 reciprocates along direction X. Any one of the panels 21 can be mounted on the distal end of the substrate transport arm 24. In this state, the substrate transport arm 24 pivots or selectively extends and contracts or selectively rises and lowers. By performing such operation at predetermined timings while moving on the base 22, the substrate transport arm 24 retrieves any one of the panels 21 from the panel stocker 23 or returns the panel 21 to the panel stocker 23.

Two mounting tables 26 are arranged in parallel on the upper surface of the base 22 along direction X with the SCARA robot 29 located between the mounting tables 26. One of the panels 21 is mounted on each of the mounting tables 26. In this state, the droplets Fb are ejected onto the panel 21 so as to mark the identification codes 10 on the substrates 2 of the panel 21. A recess is defined in an intermediate portion of each mounting table 26 and thus can receive the substrate transport arm 24. This structure permits the substrate transport arm 24 to adjust the position of the panel 21 carried by the distal end of the substrate transport arm 24 to the height of the corresponding mounting table 26. The substrate transport arm 24 is then lowered so as to mount the panel 21 on the mounting table 26. Afterwards, by repeating this operational sequence in a reverse manner, the substrate transport arm 24 removes the panel 21 from the mounting table 26 and transports the panel 21 to the panel stocker 23. In operation, the substrate transport arm 24 adjusts the position of the panel 21 in such a manner that the panel 21 is arranged at a predetermined position relative to the SCARA robot 29.

The SCARA robot 29 includes a main shaft 30, a first arm 31, a second arm 32, and a head unit 34. The main shaft 30 is secured to the base 22. An end of the first arm 31 is fixed to the main shaft 30. The second arm 32 is pivotally connected to the distal end of the first arm 31. The head unit 34 is connected to the distal end of the second arm 32 through a support shaft 33.

More specifically, a first motor M1 (see FIG. 10) operates to rotate the main shaft 30 selectively in clockwise and counterclockwise directions. The basal end of the first arm 31 is rotatably connected to the main shaft 30. The first arm 31 is thus permitted to rotate about the main shaft 30 selectively in clockwise and counterclockwise directions through rotation of the first motor M1.

The basal end of the second arm 32 is connected to the distal end of the first arm 31 through a connection shaft. The connection shaft is driven by a second motor M2 (FIG. 10) to rotate selectively in clockwise and counterclockwise directions. This structure allows the second arm 32 to rotate about the distal end of the first arm 31 selectively in clockwise and counterclockwise directions through rotation of the second motor M2. Therefore, by adjusting the rotational angle of the first arm 31 relative to the main shaft 30 and the rotational angle of the second arm 32 relative to the first arm 31, the distal end of the second arm 32, or the head unit 34, can be moved to a given position of a predetermined range defined on an x-y plane. In the illustrated embodiment, in correspondence with the length of the first arm 31 and the length of the second arm 32, the head unit 34 can be moved to any position within an area encompassed by the double-dotted broken lines of FIG. 6.

The support shaft 33, which connects the second arm 32 to the head unit 34, is driven by the third motor M3 (FIG. 10) to rotate selectively in clockwise and counterclockwise directions. The head unit 34 is thus permitted to rotate about the distal end of the second arm 32 selectively in clockwise and counterclockwise directions. In other words, through actuation of the first to third motors M1 to M3, the head unit 34 can be maintained in constant orientation relative to the movement direction of the head unit 34.

As shown in FIGS. 5 to 7, the liquid ejection apparatus 20 includes ejection maintenance devices 27, 28, which perform maintenance work for ensuring ejection of the droplets Fb. That is, the ejection maintenance devices 27, 28 monitors suction and removal of the liquid Fa from a liquid ejection head 37, wiping of the liquid ejection head 37, and traveling of the droplets Fb from the liquid ejection head 37.

Head Unit

Figure 8:
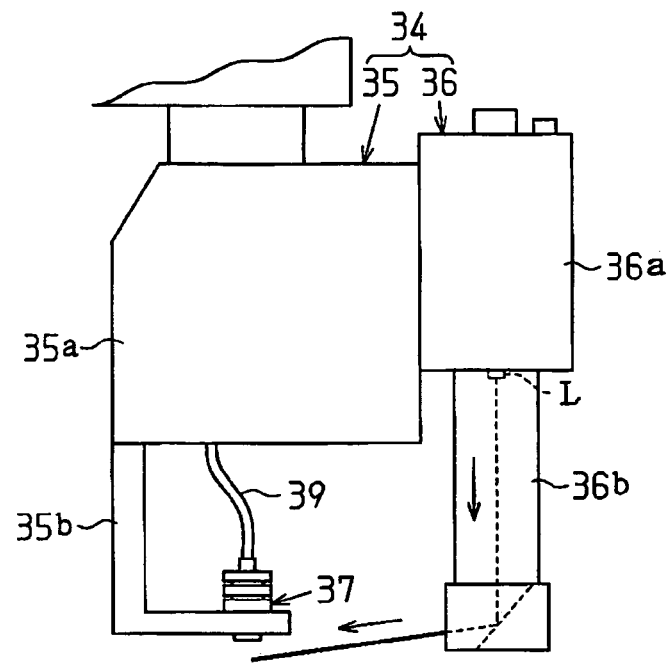
FIG. 8 is an enlarged view showing a main portion of a head unit of the SCARA robot of FIG. 5.

As shown in FIG. 8, the head unit 34 includes a liquid ejection mechanism 35 and a light source mechanism 36 that are provided as an integral body. The liquid ejection mechanism 35 has a body portion 35a and a liquid ejection head 37 supported by a support member 35b. The body portion 35a accommodates a drive substrate and an ink tank. The support member 35b extends from the body portion 35a in an L-shaped manner.

Figure 9:
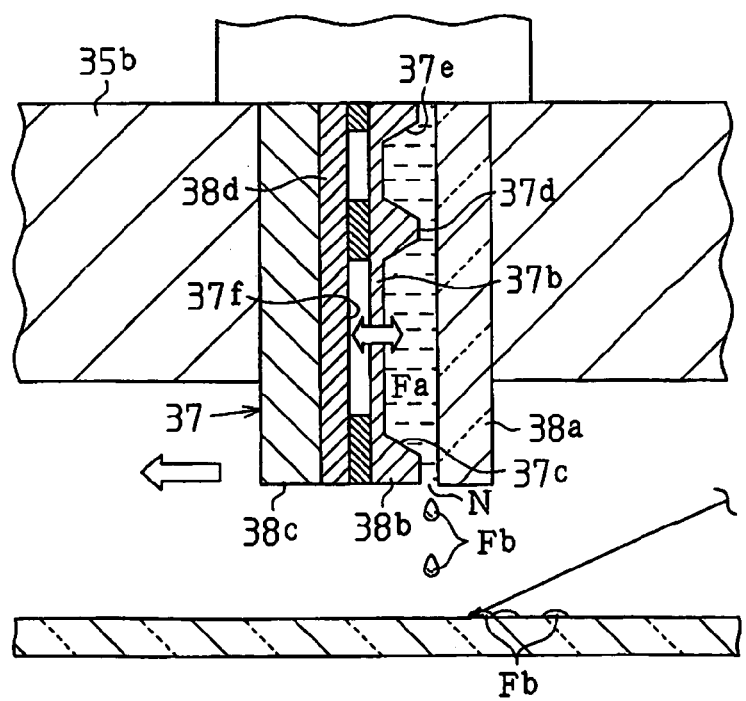
FIG. 9 is an enlarged cross-sectional view showing a liquid ejection head of the head unit of FIG. 8.

Referring to FIG. 9, the liquid ejection head 37 has a layered structure defined by a first substrate 38a, a second substrate 38b, and a third substrate 38c, which are bonded together in a stacked state. Nozzles N are defined between the first substrate 38a and the second substrate 38b.

More specifically, cavities 37c are provided between the first and second substrates 38a, 38b and communicate with the corresponding nozzles N. Each of the cavities 37c communicates with the ink tank received in the body portion 35a of the liquid ejection mechanism 35 through an orifice 37d, a liquid retainer portion 37e, and a connection tube 39 (see FIG. 8). The liquid Fa is thus supplied from the ink tank of the liquid ejection mechanism 35 to the cavities 37c.

A side wall of each cavity 37c defines an oscillation plate 37b that oscillates to selectively increase and decrease the volume of the cavity 37c. An electrostatic actuator is arranged at a side of each oscillation plate 37b opposed to the associated cavity 37c. An oscillation chamber 37f is provided between the oscillation plate 37b and the electrostatic actuator. The electrostatic actuator includes an electrode 38d that is formed on the third substrate 38c at a position opposed to the corresponding oscillation chamber 37f. The electrostatic actuator is formed of ITO and the thickness of the electrostatic actuator is approximately 0.1 micrometers. More specifically, a head driver circuit 51, which will be described later, supplies pulse voltage of 0 to 100 volts to each of the electrodes 38d. This charges the surface of the electrode 38d positively and the corresponding oscillation plate 37b negatively. Therefore, the oscillation plate 37b deforms toward the electrode 38d due to electrostatic suction caused by stored charge. This increases the volume of the associated cavity 37c, thus sending the liquid Fa from the liquid retainer portion 37e to the cavity 37c through the orifice 37d. When the stored charge is discharged from the electrode 38d, the oscillation plate 37b is released from deformation, thus decreasing the volume of the cavity 37c. Accordingly, in correspondence with the reduced volume of the cavity 37c, the liquid Fa containing metal particles is ejected onto the corresponding substrate 2 of the panel 21 through the corresponding nozzle N as the droplet Fb.

As shown in FIG. 8, a laser radiation device 36a is arranged in an upper portion of the light source mechanism 36. The laser radiation device 36a includes sixteen semiconductor lasers L serving as radiating portions. The radiation ports of the semiconductor lasers L are arranged in parallel and equally spaced, defining a single row. Each of the semiconductor lasers L opposes the corresponding one of the nozzles N. Each semiconductor laser L radiates a laser beam downwardly from the radiation port.

An optical system receiving portion 36b is provided in a lower portion of the light source mechanism 36. The optical system receiving portion 36b receives a lens or a mirror. By adjusting the angle of the lens or the mirror, the laser beam of each semiconductor laser L of the laser radiation device 36a is sent to a position in the vicinity of the corresponding nozzle N, or a position at which the droplet Fb is received by the panel 21 after having been ejected from the nozzle N.

Electrical Configuration

The electrical configuration of the liquid ejection apparatus 20, which is constructed as above-described, will hereafter be explained with reference to FIG. 10.

Figure 10:
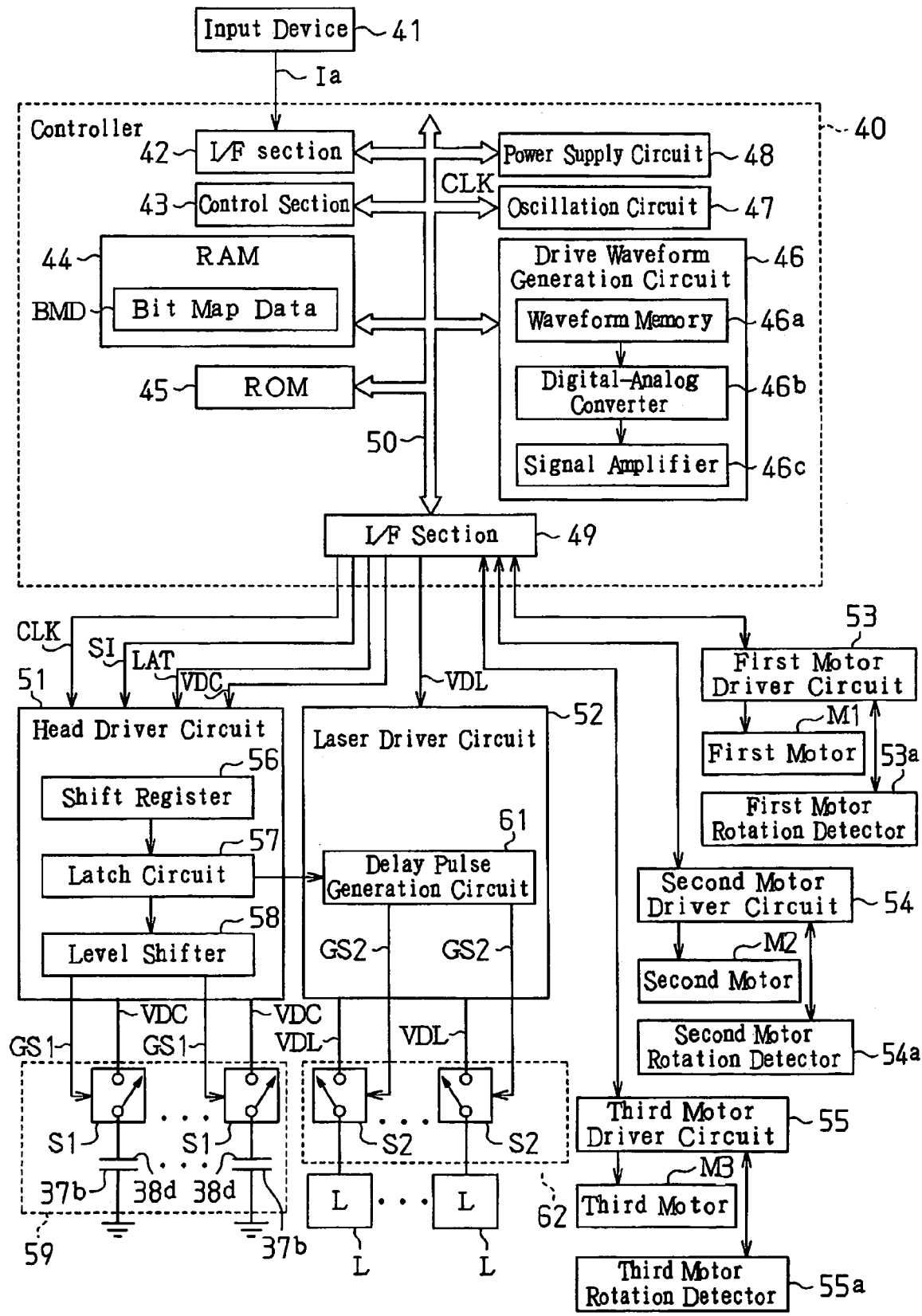
FIG. 10 is an electric diagram representing the electric configuration of the liquid ejection apparatus of FIG. 5.

As illustrated in FIG. 10, a controller 40 has an I/F section 42, a control section 43 including a CPU, a RAM 44, and a ROM 45. The I/F section 42 receives various data from an input device 41, which is formed by, for example, an external computer. The RAM 44 is defined by a DRAM and a SRAM and stores various data. The ROM 45 stores different control programs. The controller 40 also includes a drive waveform generation circuit 46, an oscillation circuit 47, a power supply circuit 48, and an I/F section 49. The oscillation circuit 47 generates a clock signal CLK for synchronizing different drive signals. The power supply circuit 48 generates laser drive voltage VDL for driving the semiconductor lasers L. The I/F section 49 transmits various drive signals. In the controller 40, the I/F section 42, the control section 43, the RAM 44, the ROM 45, the drive waveform generation circuit 46, the oscillation circuit 47, the power supply circuit 48, and the I/F section 49 are connected together through a bus 50.

More specifically, the I/F section 42 receives an image of the identification code 10 as a prescribed form of dot formation data Ia. The identification code 10 is defined as a two-dimensional code formed by a known method and represents identification data regarding the product number or the lot number of the panel 21. In correspondence with the dot formation data Ia received by the I/F section 42, the control section 43 performs an identification code formation procedure. That is, the control section 43 executes a control program (for example, an identification code formation program) stored in the ROM 45 using the RAM 44 as a processing area. In accordance with the program, the control section 43 carries out a transport procedure for transporting the panel 21 and a droplet ejection procedure by activating the electrostatic actuators of the liquid ejection head 37. Further, in accordance with the identification code formation program, the control section 43 drives the semiconductor lasers L and thus performs a drying procedure for drying the droplets Fb.

More specifically, the control section 43 performs a prescribed development procedure on the dot formation data Ia that has been received by the I/F section 42. This produces bit map data BMD that indicates whether the droplets Fb must be ejected onto the cells C that are defined on a two-dimensional code formation plane (the dot formation area Z1). The bit map data BMD is then stored in the RAM 44. The bit map data BMD is defined by serial data that has a bit length of 16×16 bits in correspondence with the electrostatic actuators. That is, in accordance with the value (0 or 1) of each bit, the corresponding electrostatic actuator, which includes the oscillation plate 37b and the electrode 38d, is selectively activated.

The control section 43 performs an additional development procedure, which is different from the development procedure that has been performed on the bit map data BMD, on the dot formation data Ia. This produces waveform data of electrostatic actuator drive voltage VDC, or voltage supplied to each of the electrostatic actuators. The waveform data is then output to the drive waveform generation circuit 46. The drive waveform generation circuit 46 has a waveform memory 46a, a digital-to-analog converter 46b, and a signal amplifier 46c. The waveform memory 46a stores the waveform data, which has been generated by the control section 43. The digital-to-analog converter 46b converts the waveform data into an analog signal and outputs the analog signal to the signal amplifier 46c. The signal amplifier 46c amplifies the analog waveform signal. Thus, the drive waveform generation circuit 46 converts the waveform data stored in the waveform memory 46a into the analog signal by means of the digital-to-analog converter 46b. The analog waveform signal is then amplified by the signal amplifier 46c and thus the electrostatic actuator drive voltage VDC is generated.

Further, the control section 43 serially transfers the bit map data BMD as an ejection control signal SI to the head driver circuit 51 (a shift register 56), which will be later described, through the I/F section 49. The ejection control signal SI is produced by synchronizing the bit map data BMD with the clock signal CLK generated by the oscillation circuit 47. The control section 43 also sends a latch signal LAT to the head driver circuit 51 for latching the transferred ejection control signal SI. Further, the control section 43 supplies the electrostatic actuator drive voltage VDC to the head driver circuit 51 (switch elements S1) synchronously with the clock signal CLK.

The head driver circuit 51, a laser driver circuit 52, a first motor driver circuit 53, a second motor driver circuit 54, and a third motor driver circuit 55 are connected to the controller 40 via the I/F section 49.

The head driver circuit 51 has the shift register 56, a latch circuit 57, a level shifter 58, and a switch circuit 59. The shift register 56 converts the ejection control signal SI, which has been serially transferred from the controller 40 (the control section 43), to a parallel signal in correspondence with the electrodes 38d of the sixteen electrostatic actuators. The latch circuit 57 latches the parallel 16-bit ejection control signal SI synchronously with the latch signal LAT, which has been sent from the controller 40 (the control section 43). The latched ejection control signal SI is then output to the level shifter 58 and the laser driver circuit 52. The level shifter 58 raises the voltage of the latched ejection control signal SI to the drive voltage of the switch circuit 59. In this manner, an open-close signal GS1 is generated in correspondence with each of the electrodes 38d of the electrostatic actuators.

Switch elements S1 are provided in correspondence with the electrodes 38d and connected to the switch circuit 59. The electrostatic actuator drive voltage VDC is supplied commonly to the inputs of the switch elements S1. The outputs of the switch elements S1 are connected to the corresponding electrodes 38d. Each switch element S1 receives the corresponding open-close signal GS1 from the level shifter 58. In correspondence with the open-close signal GS1, it is determined whether the electrostatic actuator drive voltage VDC should be supplied to the corresponding electrostatic actuator.

More specifically, in the illustrated embodiment, the control section 43 of the controller 40 supplies the electrostatic actuator drive voltage VDC, which has been generated by the drive waveform generation circuit 46, to the electrostatic actuators through the corresponding switch elements S1. Further, the control section 43 generates the ejection control signal SI (the open-close signals GS1) for controlling operation of each switch element S1, thus controlling supply of the electrostatic actuator drive voltage VDC. When any switch element S1 is closed, the electrostatic actuator drive voltage VDC is supplied to the corresponding electrode 38d. The droplet Fb is thus ejected from the nozzle N corresponding to the associated electrostatic actuator. The latch signal LAT is output when each of the rows of the cells C in the dot formation area Z1 of each substrate 2 reaches the position immediately below the nozzles N. In response to the latch signal LAT, the corresponding electrostatic actuators are activated and the droplets Fb are ejected from the corresponding nozzles N. This forms the dots D in the selected cells C (the black cells C1) of the dot formation area Z1.

In response to the fall of the latch signal LAT, which has been sent from the control section 43 to the head driver circuit 51, the open-close signals GS1 are produced in correspondence with the 16-bit ejection control signal SI. The electrostatic drive voltage VDC is thus supplied to the electrostatic actuators corresponding to the open-close signals GS1 that have been generated. In this state, the voltage VC of each of the corresponding electrodes 38d, which defines a capacitor with respect to the associated oscillation plate 37b, increases as the electrostatic actuator drive voltage VDC rises. This causes the electrostatic actuators to electrostatically contract, thus introducing the liquid Fa into the corresponding cavities 37c. Subsequently, as the electrostatic actuator drive voltage VDC decreases, the electrostatic actuators send the liquid Fa out from the cavities 37c, thus ejecting the droplets Fb. The electrostatic actuator drive voltage VDC then restores the initial value, thus completing the ejection of the droplets Fb through activation of the electrostatic actuators.

As shown in FIG. 10, the laser driver circuit 52 has a delay pulse generation circuit 61 and a switch circuit 62. The delay pulse generation circuit 61 generates a pulse signal (an open-close signal GS2) by delaying the ejection control signal SI, which has been latched by the latch circuit 57 in response to the fall of the latch signal LAT, by a predetermined standby time. The open-close signal GS2 is then output to the switch circuit 62. The standby time is defined as the laser radiation time of each semiconductor laser L with respect to the droplet Fb that has been received by the corresponding cell C, with reference to a timing at which the electrostatic actuators are activated (in response to the fall of the latch signal LAT). The standby time is a predetermined value obtained by a test. The delay pulse generation circuit 61 also outputs open-close signals GS2 to the switch circuit 62 after the standby time has elapsed, or when the droplets Fb reach the radiating positions of the laser beams. Each open-close signal GS2 is generated based on the ejection control signal SI that has been latched by the latch circuit 57 in response to the fall of the latch signal LAT.

The switch circuit 62 includes sixteen switch elements S2 in correspondence with the semiconductor lasers L. The laser drive voltage VDL, which has been produced by the power supply circuit 48, is supplied commonly to the inputs of the switch elements S2. The outputs of the switch elements S2 are connected to the corresponding semiconductor lasers L. Each switch element S2 receives the corresponding open-close signal GS2 from the delay pulse generation circuit 61. In correspondence with the open-close signal GS2, it is determined whether the laser drive voltage VDL should be supplied to the corresponding semiconductor laser L. That is, in the liquid ejection apparatus 20 of the illustrated embodiment, the laser drive voltage VDL of the power supply circuit 48 is supplied commonly to the semiconductor lasers L through the corresponding switch elements S2. Further, operation of each switch element S2 is controlled in correspondence with the ejection control signal SI (the open-close signal GS2) provided by the controller 40 (the control section 43). When any switch element S2 is closed, the laser drive voltage VDL is supplied to the semiconductor laser L corresponding to the switch element S2 and a laser beam is radiated by the semiconductor laser L.

In other words, each open-close signal GS2 is generated after the standby time has elapsed following input of the latch signal LAT to the head driver circuit 51. In response to the rise of the open-close signal GS2, supply of the laser drive voltage VDL to the corresponding semiconductor laser L is started. This optimizes the laser radiation timing of the semiconductor laser L, which radiates a laser beam onto the corresponding droplet Fb that has been received by the substrate 2 (the corresponding black cell C1) and moves along the radiating position of the semiconductor laser L. Afterwards, the open-close signal GS2 falls and thus the supply of the laser drive voltage VDL stops. The drying procedure by means of the semiconductor laser L is thus ended.

The first to third motor driver circuits 53 to 55 are connected to the controller 40 through the I/F section 49. The controller 40 sends a first motor drive signal, a second motor drive signal, and a third motor drive signal to the first motor driver circuit 53, the second motor driver circuit 54, and the third motor driver circuit 55, respectively. In response to the corresponding one of the firs to third motor drive signals, each of the first to third motor driver circuits 53 to 55 operates to rotate the associated one of the first to third motors M1 to M3 in a forward or reverse direction. Specifically, if the first motor M1 is rotated in the forward direction, the first arm 31, which is fixed to the main shaft 30, is rotated clockwise. If the first motor M1 is rotated in the reverse direction, the first arm 31 is rotated counterclockwise. If the second motor M2 is rotated in the forward direction, the second arm 32 is rotated clockwise around the distal end of the first arm 31. If the second motor M2 is rotated in the reverse direction, the second arm 32 is rotated counterclockwise. If the third motor M3 is rotated in the forward direction, the support shaft 33 is rotated and thus the head unit 34 is rotated clockwise around the distal end of the second arm 32. If the third motor M3 is rotated in the reverse direction, the head unit 34 is rotated counterclockwise.

A first motor rotation detector 53*a*, a second motor rotation detector 54*a*, and a third motor rotation detector 55*a* are connected to the controller 40 respectively through the first motor driver circuit 53, the second motor driver circuit 54, and the third motor driver circuit 55. Each of the first to third motor rotation detectors 53*a* to 55*a* provides a detection signal to the controller 40. In correspondence with the detection signals, the controller 40 detects the rotational direction and the rotational amount of each of the first to third motors M1 to M3. The controller 40 thus calculates the position of the head unit 34 on the x-y plane and the orientation of the head unit 34.

Figure 11:
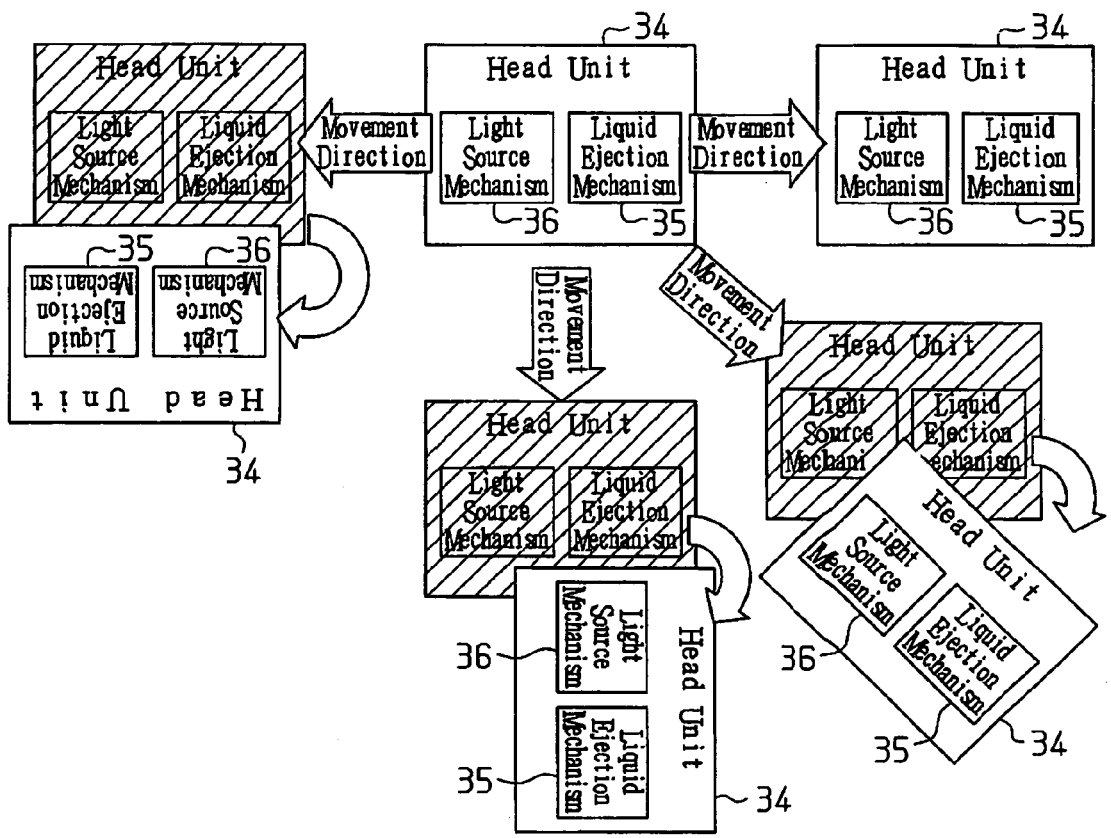
FIG. 11 is a schematic view for explaining operation of the head unit of FIG. 8.

In the illustrated embodiment, as illustrated in FIG. 11, the control section 43 of the controller 40 operates to rotate the support shaft 33 in such a manner that the liquid ejection mechanism 35 precedes the light source mechanism 36 in the movement direction of the head unit 34. In other words, the control section 43 of the controller 40 controls the third motor driver circuit 55 to activate the third motor M3 so that laser radiation by the semiconductor lasers L onto the droplets Fb is performed after the droplets Fb have been ejected from the corresponding nozzles N onto the panel 21. That is, the third motor M3 operates to rotate the head unit 34 from each of the hatched states of FIG. 11 to the corresponding state in which the liquid ejection mechanism 35 precedes the light source mechanism 36 in the movement direction of the head unit 34.

Figure 12:
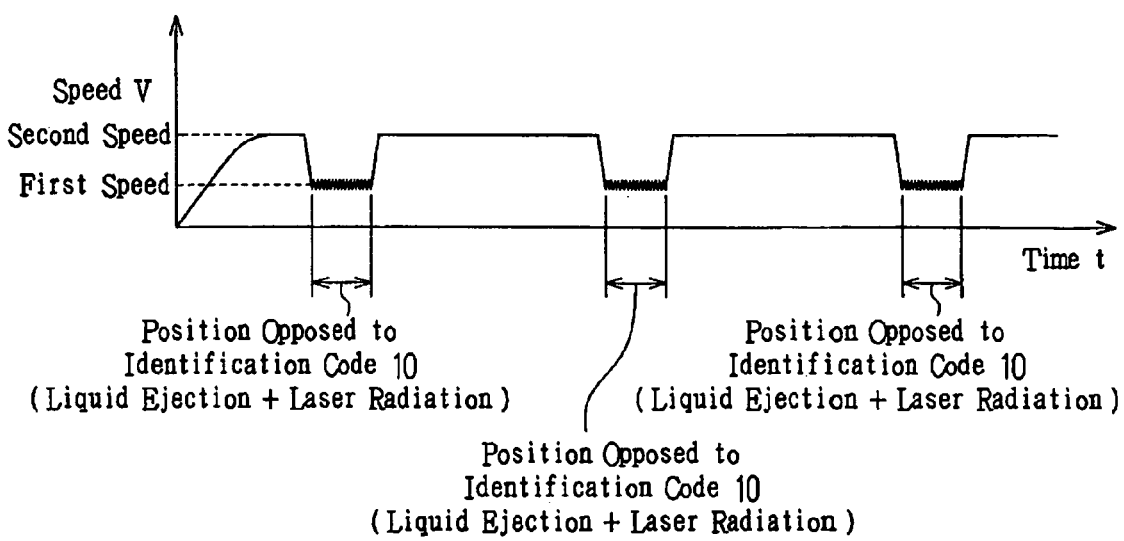
FIG. 12 is a diagram of speed versus time for explaining the movement speed of the head unit of FIG. 8.

Further, the control section 43 of the controller 40 controls the movement speed of the head unit 34 as shown in FIG. 12. The diagram represents the movement speed of the head unit 34 in direction X or a direction opposite to direction X. Specifically, the control section 43 moves the head unit 34 at a relatively high speed, or a second speed, until the head unit 34 reaches the dot formation area Z1 of the target substrate 2 in which the identification code 10 is to be formed. At this stage, the movement speed of the head unit 34 is lowered to a first speed for ejecting the droplets Fb onto the substrate 2. The first speed is determined in correspondence with the ejection speed of the liquid ejection head 37 at which the droplets Fb can be ejected onto the cells C that are arranged adjacently. Alternatively, the first speed may be defined as the speed that ensures sufficient drying and baking times through the laser radiation. When the identification code 10 is complete, the movement speed of the head unit 34 is re-increased to the second speed. The head unit 34 then moves toward the dot formation area Z1 of the subsequent target substrate 2 in which the identification code 10 is to be formed. When reaching the vicinity of the dot formation area Z1, the head unit 34 slows down to the first speed. The control section 43 restricts the movement speed (the second speed) of the head unit 34 moving from one dot formation area Z1 to another to a level that prevents the droplets Fb from leaking from the head unit 34 due to acceleration acting on the head unit 34.

Formation of Identification Code

Using the liquid ejection apparatus 20, the identification code 10 is formed on each of the substrates 2 forming the panel 21 in the following manner.

First, the substrate transport arm 24 retrieves the target panel 21 on which the identification codes 10 are to be formed from the panel stocker 23. The panel 21 is then transported to and mounted on the corresponding mounting table 26. In the illustrated embodiment, each panel 21 is formed as an integral body of the multiple substrates 2, which are aligned along directions X and Y. The identification codes 10 are formed at the same positions of the substrates 2. Each group of the substrates 2 extending along direction X is referred to as a row of the substrates 2. Referring to FIGS. 13A to 16A, the rows of the substrates 2 are sequentially numbered from downward to upward, starting from a first row.

The control section 43 of the controller 40 moves the head unit 34 of the SCARA robot 29 alternately in direction X and a direction opposite to direction X, as indicated by the solid arrows of FIG. 13A. More specifically, the head unit 34 proceeds in direction X when moving along an odd-numbered row of the substrates 2. The head unit 34 proceeds in the direction opposite to direction X when moving along an even-numbered row of the substrates 2. Meanwhile, the control section 43 operates to maintain the orientation of the head unit 34 in such a manner that the liquid ejection mechanism 35 precedes the light source mechanism 36 in the moving direction of the head unit 34, referring to FIG. 11.

More specifically, the control section 43 of the controller 40 activates the first to third motor driver circuits 53 to 55. The head unit 34 is thus moved to the dot formation area Z1, in which the identification code 10 is to be formed, of the substrate 2 that is located in the bottom lower end of the panel 21, as viewed in FIGS. 13A and 13B. More specifically, referring to FIG. 12, the control section 43 moves the head unit 34 at the relatively high speed (the second speed) until the head unit 34 reaches the vicinity of the dot formation area Z1. At this stage (for example, when the head unit 34 proceeds in the blank area Z2), the control section 43 decelerates the head unit 34 so that the movement speed of the head unit 34 corresponds to the predetermined level (the first speed) when the head unit 34 reaches the dot formation area Z1.

While moving the head unit 34, the controller 40 sends the ejection control signal SI, which is generated based on the bit map data BMD stored in the ROM 45, to the head driver circuit 51 in accordance with the identification code formation program. The controller also supplies the electrostatic actuator drive voltage VDC, which has been generated by the drive waveform generation circuit 46, to the head driver circuit 51 and the laser drive voltage VDL produced by the power supply circuit 48 to the laser driver circuit 52. The controller 40 then stands by until the latch signal LAT must be output.

When the head unit 34 reaches the dot formation area Z1, the control section 43 of the controller 40 activates the first to third motor driver circuits 53 to 55. The head unit 34 is thus moved in direction X while the droplets Fb are ejected from the liquid ejection head 37 and irradiated with the laser beams radiated by the semiconductor lasers L. While moving the head unit 34 at the predetermined speed (the first speed) in direction X, the control section 43 operates the first to third motors M1 to M3 to maintain the orientation of the head unit 34 in the aforementioned manner. Accordingly, referring to FIGS. 13A, 13B, the liquid ejection mechanism 35 constantly precedes the light source mechanism 36 in direction X (the movement direction of the head unit 34).

Specifically, the controller 40 provides the latch signal LAT to the head driver circuit 51. The head driver circuit 51 then generates the open-close signals GS1 in correspondence with the ejection control signal SI, which has been processed in correspondence with the latch signal LAT. The open-close signals GS1 are then sent to the switch circuit 59. This supplies the electrostatic actuator drive voltage VDC to the electrostatic actuators corresponding to the switch elements S1 that are held in a closed state. The corresponding nozzles N thus simultaneously eject the droplets Fb by an amount corresponding to the electrostatic actuator drive voltage VDC.

In response to the ejection control signal SI, the delay pulse generation circuit 61 of the laser driver circuit 52 starts generating the open-close signals GS2. After the aforementioned standby time has elapsed, the delay pulse generation circuit 61 outputs the open-close signals SG2 to the switch circuit 62. The laser drive voltage VDL is thus supplied to the semiconductor lasers L corresponding to the switch elements S2 that are held in a closed state. This causes the semiconductor lasers L to radiate the laser beams. The laser beams are then radiated onto the droplets Fb by the lens or the mirror received in the optical system receiving portion 36b immediately after the droplets Fb have been received by the substrate 2. The dispersion medium of the droplets Fb is thus evaporated and the droplets Fb become dry. Further, the metal particles of the droplets Fb are baked and securely bonded with the substrate 2.

Afterwards, in the same manner as has been described, the droplets Fb are ejected by the corresponding nozzles N and received by the substrate 2. The droplets Fb are then irradiated with the laser beams of the corresponding semiconductor lasers L and thus dried and baked. In this manner, the semispherical dots D defining the identification code 10 are provided in accordance with each of the rows of the cells C.

After the identification code 10 has been completely formed on the substrate 2, the control section 43 of the controller 40 continuously operates the first to third motor driver circuits 53 to 55. The head unit 34 is thus moved in direction X to the dot formation area Z1 of the adjacent substrate 2. Specifically, referring to FIG. 12, the control section 43 operates the head unit 34 at the relatively high speed, or the second speed, in direction X until the head unit 34 reaches the vicinity of the dot formation area Z1. The head unit 34 is then decelerated to the relatively low speed, or the first speed, so that the droplets Fb are ejected onto the substrate 2 by the head unit 34 that is moving at the first speed.

With reference to FIGS. 14A and 14B, when formation of the identification codes 10 on all of the substrates 2 of the first row is complete, the head unit 34 is arranged at a rearmost end of the panel 21 in direction X (the bottom right end as viewed in the drawings). The control section 43 of the controller 40 then moves the head unit 34 to the second row of the substrates 2. At this stage, the control section 43 changes the orientation of the head unit 34 from the state of FIGS. 14A and 14B to the state of FIGS. 15A and 15B. More specifically, the control section 43 first moves the head unit 34 in direction Y while maintaining the position of the head unit 34 in direction X. The control section 43 then rotates the head unit 34 at 180 degrees and thus reverses the orientation of the head unit 34.

Figure 15A:
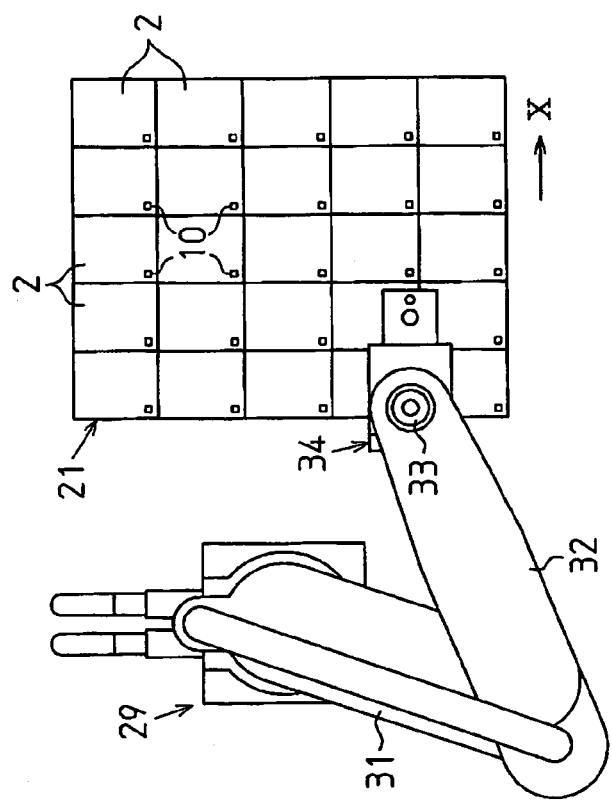
Figure 15B:
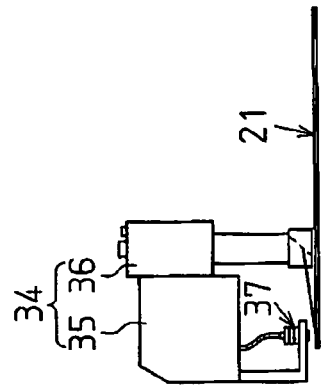

Further, the head unit 34 of the liquid ejection apparatus 20 is moved in the direction opposite to direction X so as to form the identification codes 10 on the substrates 2 of the second row. While the head unit 34 is moving, the electrostatic actuator drive voltage VDC is supplied to the corresponding electrostatic actuators and thus the droplets Fb are ejected from the corresponding nozzles N. The droplets Fb are then irradiated with the laser beams of the corresponding semiconductor lasers L. Also in the second row of the substrates 2, when moving the head unit 34 from the finished dot formation area Z1 to the subsequent dot formation area Z1, the control section 43 of the controller 40 moves the head unit 34 at the relatively high speed, or the second speed. When the head unit 34 reaches the vicinity of the subsequent dot formation area Z1, the control section 43 decelerates the head unit 34 to the relatively low speed, or the first speed. Then, the control section 43 moves the head unit 34 at the predetermined speed (the first speed) in the direction opposite to direction X while maintaining the orientation of the head unit 34 as shown in FIGS. 15A and 15B. In this manner, the liquid ejection mechanism 35 constantly precedes the light source mechanism 36 in the direction opposite to direction X (the movement direction of the head unit 34).

Figure 16A:
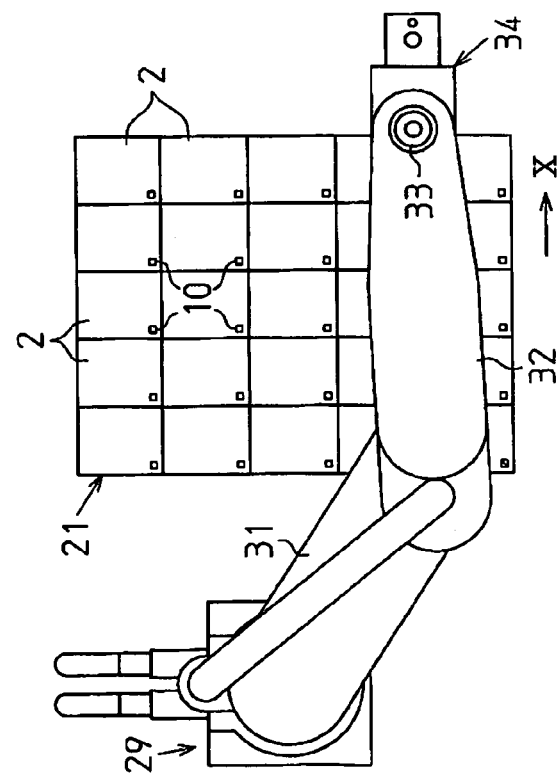
Figure 16B:
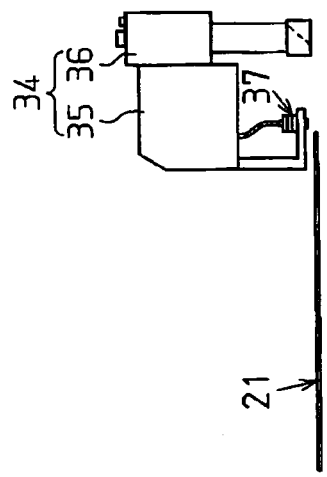

When formation of the identification codes 10 is completed for all of the substrates 2 of the second row, referring to FIGS. 16A and 16B, the control section 43 of the controller 40 changes the position and the orientation of the head unit 34 so that the head unit 34 can operate on the third row of the substrates 2. More specifically, the control section 43 moves the head unit 34 in direction Y while rotating the head unit 34 at 180 degrees and maintaining the position of the head unit 34 in direction X. Then, in the same manner as has been described for the first and second rows of the substrates 2, the control section 43 operates the head unit 34 to eject the droplets Fb and radiate the laser beams while moving the head unit 34 at the predetermined speed (the first speed) in direction X. While the head unit 34 is moving, the orientation of the head unit 34 is maintained in such a manner that the liquid ejection mechanism 35 precedes the light source mechanism 36 in direction X (the movement direction of the head unit 34). In this state, the identification codes 10 are formed on the substrates 2 of the panel 21.

After the identification codes 10 are formed on all of the substrates 2 defining the panel 21, the controller 40 retreats the SCARA robot 29 from above the substrates 2. Subsequently, the controller 40 operates the substrate transport arm 24 to return the completed panel 21 to the panel stocker 23. The substrate transport arm 24 then retrieves the subsequent target panel 21 from the panel stocker 23. The panel 21 is thus subjected to the above-described operation.

The illustrated embodiment, which is constructed as above-described, has the following advantages.

(1) In the illustrated embodiment, the control section 43 moves the head unit 34 of the SCARA robot 29 alternately in direction X and the direction opposite to direction X. That is, the head unit 34 proceeds in direction X when moving along an odd-numbered row of the substrates 2 but in the direction opposite to direction X when moving along an even-numbered row of the substrates 2. While moving the head unit 34, the control section 43 adjusts the orientation of the head unit 34 in such a manner as to arrange the liquid ejection mechanism 35 before the light source mechanism 36 in the movement direction of the head unit 34, as illustrated in FIG. 11. The liquid ejection mechanism 35 thus constantly precedes the light source mechanism 36, or the light source mechanism 36 constantly follows the liquid ejection mechanism 35, in the movement direction of the head unit 34. The droplets Fb are thus first ejected from the liquid ejection head 37 of the liquid ejection mechanism 35. After the liquid ejection head 37 retreats from above the droplets Fb, the droplets Fb are irradiated with the laser beams by the light source mechanism 36. Accordingly, laser radiation onto the ejected droplets Fb is performed at constant timings regardless of the movement direction of the liquid ejection head 37. This improves efficiency for drying and baking the droplets Fb.

(2) In the illustrated embodiment, the control section 43 moves the head unit 34 at the relatively high speed (the second speed) until the head unit 34 reaches the dot formation area Z1 of the target substrate 2. The head unit 34 is then decelerated to the relatively low speed (the first speed) so that the head unit 34 can start ejection of the droplets Fb. After completing formation of the identification code 10, the control section 43 accelerates the head unit 34 to the second speed until the head unit 34 reaches the vicinity of the dot formation area Z1 of the subsequent target substrate 2. The head unit 34 is then re-decelerated to the first speed. In other words, the control section 43 moves the head unit 34 at the relatively low speed when ejecting the droplets Fb but at the relatively high speed when moving the head unit 34 from one dot formation area Z1 to another. This increases the speed for forming the identification codes 10 in the order defined by direction X. Further, formation of the identification codes 10 on the panel 21 is rapidly completed.

(3) In the illustrated embodiment, the head unit 34 is moved at the first speed when the droplets Fb are ejected. The first speed is determined in correspondence with the ejection speed of the liquid ejection head 37 at which the droplets Fb are ejected onto the cells C that are arranged adjacently. Alternatively, the first speed may be determined as the speed that ensures sufficient laser radiation time for drying and baking the droplets Fb. The movement speed of the head unit 34 is re-increased when any identification code 10 is finished and re-decreased when reaching the vicinity of the subsequent dot formation area Z1. Therefore, ejection of the droplets Fb and drying and baking of the droplets Fb are further reliably carried out for forming the identification codes 10. The speed for forming the identification codes 10 on the panel 21 is also increased.

(4) In the illustrated embodiment, the SCARA robot 29 is formed by an articulated robot having the liquid ejection head 37 provided at the distal end of the second arm 32. This decreases load of a driver portion that drives the liquid ejection head 37 and thus increases the movement speed of the liquid ejection head 37 compared to, for example, a linear movement mechanism. Further, the SCARA robot 29 moves the liquid ejection head 37 and maintains the orientation of the liquid ejection head 37 through combination of rotations of the first to third motors M1 to M3. This further increases the movement speed of the liquid ejection head 37, compared to a case in which the liquid ejection head 37 is moved through linear movement.

(5) In the illustrated embodiment, the control section 43 moves the head unit 34 in direction X along an odd-numbered row of the substrates 2 and in the direction opposite to direction X along an even-numbered row of the substrates 2. In other words, the control section 43 selects the movement path of the head unit 34 in such a manner as to minimize the distance covered by the head unit 34 for forming the identification codes 10 on all of the substrates 2 of the panel 21. Since the control section 43 is operated along such movement path, the time needed for completing the movement path is shortened, and productivity is further improved.

(6) In the illustrated embodiment, the two mounting tables 26 are arranged beside the SCARA robot 29, which is located between the mounting tables 26. This structure allows the substrate transport arm 24 to replace the panel 21 mounted on one of the mounting tables 26 while the droplets Fb are ejected onto the panel 21 mounted on the other mounting table 26. Therefore, when the panel 21 is finished, the SCARA robot 29 is allowed to sequentially operate on the subsequent panel 21 without standing by for replacement of the panel 21. This improves efficiency for performing liquid ejection on the panels 21.

It should be apparent to those skilled in the art that the present invention may be embodied in many other specific forms without departing from the spirit or scope of the invention. Particularly, it should be understood that the invention may be embodied in the following forms.

In the illustrated embodiment, the control section 43 operates the liquid ejection head 37 to eject the droplets Fb while moving the head unit 34 selectively in direction X and the direction opposite to direction X. However, the liquid ejection may be carried out by moving the head unit 34 selectively in direction Y and a direction opposite to direction Y or in a diagonal direction.

In the illustrated embodiment, the movement speed (the second speed) of the head unit 34 from one dot formation area Z1 to another is limited to the level that suppresses leakage of the droplets Fb from the nozzles N, which is caused by acceleration acting on the head unit 34. However, the control section 43 may apply negative pressure to the liquid Fa retained in the cavities 37c while moving the head unit 34 from one dot formation area Z1 to another. This also suppresses the leakage of the droplets Fb from the nozzles N and further increases the movement speed of the head unit 34.

In the illustrated embodiment, the control section 43 maintains the orientation of the head unit 34 in the state in which the liquid ejection head 37 precedes the semiconductor lasers L, or the liquid ejection mechanism 35 precedes the light source mechanism 36, in the movement direction of the head unit 34. However, the positions of the liquid ejection head 37 and the semiconductor lasers L are not restricted to those of the embodiment but may be modified to any other suitable positions, as long as the liquid ejection head 37 and the semiconductor lasers L are maintained at constant positions in correspondence with the movement direction of the head unit 34.

In the illustrated embodiment, the position of the head unit 34, in which the liquid ejection head 37 and the semiconductor lasers L are arranged, is adjusted by means of the SCARA robot 29. However, the position of the head unit 34 may be adjusted through any other suitable mechanism, which is, for example, a linear movement mechanism.

In the illustrated embodiment, by adjusting the rotation angles of the first to third motors M1 to M3, the SCARA robot 29 is allowed to move the head unit 34 to any position in the range defined on the x-y plane as indicated by the double-dotted broken lines of FIG. 6, while maintaining the head unit 34 in a given orientation. However, the SCARA robot 29 may be allowed to operate the head unit 34 also in a direction vertical to the x-y plane. In this case, regardless of heights of the dot formation areas Z1 in which the identification codes 10 are to be formed, ejection of the droplets Fb and radiation of the laser beams can be performed under uniform conditions.

In the illustrated embodiment, each of the panels 21 onto which the droplets Fb are ejected is defined by the identical substrates 2, which are aligned in a matrix-like manner. Instead of this, the panel 21 may be formed by differently sized substrates that are connected together as an integral body.

Although each dot D of the illustrated embodiment has the semispherical shape, the shape of the dot D may be modified to any other suitable shape. For example, each dot D may have an oval shape or a linear shape like a bar of a bar code as viewed from above.

In the illustrated embodiment, the identification codes 10 are defined by the two-dimensional codes. However, for example, bar codes, characters, numerals, or marks may be provided by the liquid ejection apparatus 20.

In the illustrated embodiment, the identification codes 10 are formed on the substrates 2 as display substrates. However, the identification codes 10 may be formed on silicon wafers, resin films, or metal plates.

In the illustrated embodiment, ejection of the droplets Fb is performed through activation of the electrostatic actuators. Instead of this, the liquid ejection head 37 may include a pressurizing portion that pressurizes the pressure chambers (the cavities 37c) without using the electrostatic actuators. For example, pressurization of the cavities 37c, or ejection of the droplets Fb, may be achieved by a method using a piezo element or air bubbles. If the piezo element is used, the piezo element is placed in contact with the oscillation plate 37b defining the wall of the corresponding cavity 37c. In response to a drive signal, the volume of the cavity 37c is changed and thus the droplet Fb is ejected from the cavity 37c. Alternatively, air bubbles may be generated and caused to burst in the cavities 37c and thus the droplets Fb are ejected. In either of these cases, the advantages of the illustrated embodiment are ensured by the control section 43 that controls the SCARA robot 29 having the liquid ejection head 37 in the above-described manner.

In the illustrated embodiment, the present invention is embodied as the liquid ejection apparatus 20 for forming the dots D of the identification codes 10. However, the present invention may be applied to a liquid ejection apparatus for forming metal wiring on a substrate by ejecting droplets of liquid containing wiring material, or functional material, onto the substrate. Further, the present invention may be embodied as a liquid ejection apparatus for forming an insulating film. In either case, the liquid ejection apparatus sufficiently dries and bakes the droplets.

In the illustrated embodiment, the liquid crystal display modules 1 are manufactured by the liquid ejection apparatus 20. However, each of the substrates 2 on which the identification code 10 is formed may be incorporated in a display module of, for example, an organic electroluminescence display. Alternatively, the substrate 2 may be used in a display module of a field effect type device (FED or SED) that has a flat electron emission element. The device emits light from a fluorescent substance using electrons emitted by the element. Further, the substrates 2 on which the identification codes 10 are formed may be used in any suitable electronic devices other than the displays.

The present examples and embodiments are to be considered as illustrative and not restrictive and the invention is not to be limited to the details given herein, but may be modified within the scope and equivalence of the appended claims.

The invention claimed is:

1. A liquid ejection apparatus comprising:
    a head unit that is movable on an object at least in two-dimensional directions, the head unit including a plurality of ejecting portions and a plurality of radiating portions, each of the ejecting portions ejecting droplets onto the object from a nozzle, and wherein each of the radiating portions radiating a laser beam onto the droplet received by the object;
    a controller that adjusts positions of the ejecting portions and positions of the radiating portions in correspondence with a movement direction of the head unit;
    an articulated robot having a multi-jointed arm assembly with the head unit being connected to a distal end of the arm assembly,
    wherein each of the radiating portions includes a laser having a radiation port, the radiation ports being arranged in parallel and equally spaced, defining a single row;
    wherein each of the lasers opposes a corresponding one of the nozzles, and wherein each of the lasers radiates a laser beam from each of the radiation ports.

2. The apparatus according to claim 1, wherein the controller adjusts the positions of the ejecting portion and the radiating portion in such a manner that the ejecting portion precedes the radiating portion in the movement direction of the head unit.

3. The apparatus according to claim 1, wherein the object includes a plurality of droplet receiving areas in each of which the droplets are received by the object, the droplet receiving areas being spaced apart from one another, a movement path including all of the droplet receiving areas being defined, wherein the controller sets the movement path in such a manner as to minimize the distance corresponding to the movement path and controls the robot to move the head unit along the movement path.

4. The apparatus according to claim 1, wherein the robot is arranged on a base, the robot further including a main shaft pivotally arranged on the base, wherein the multi-jointed arm assembly includes:

a first arm connected to the main shaft; and a second arm pivotally connected to the first arm, wherein the head unit is pivotally connected to the second arm.

5. The apparatus according to claim 1, wherein the object includes a plurality of droplet receiving areas in each of which droplets are received by the object, the droplet receiving areas being spaced apart from one another; and wherein the controller moves the head unit at a first speed when the ejecting portion is ejecting the droplets to any of the droplet receiving areas and at a second speed that is higher than the first speed when the ejecting portion is moving from one of the droplet receiving areas to another.

6. The apparatus according to claim 5, wherein the droplet is dried and baked through radiation of the laser beam, and wherein the controller determines the first speed in correspondence with a laser radiation time that ensures drying and baking of the droplet.

7. The apparatus according to claim 5, wherein the controller determines the first speed in correspondence with an ejection speed of the droplets ejected by the ejecting portion.

8. The apparatus according to claim 7, wherein each of the droplet receiving areas includes a plurality of data cells, and wherein the first speed is set to a level at which ejection of the droplets is sequentially performed on each of the data cells that are arranged adjacently.

* * * * *